United States Patent [19]

Araoka et al.

[11] Patent Number: 5,694,775
[45] Date of Patent: Dec. 9, 1997

[54] MAGNETIC RESONANCE DIAGNOSTIC APPARATUS

[75] Inventors: Katumasa Araoka, Kawasaki; Hidehiko Okada, Tokyo, both of Japan

[73] Assignee: Kabushiki Kaisha Toshiba, Kawasaki, Japan

[21] Appl. No.: 716,862

[22] Filed: Sep. 20, 1996

[30] Foreign Application Priority Data

Sep. 28, 1995 [JP] Japan .................................. 7-250411

[51] Int. Cl.$^6$ ................................................. F25B 19/00
[52] U.S. Cl. .............................................. 62/51.1; 324/318
[58] Field of Search ............................... 62/51.1; 324/318

[56] References Cited

U.S. PATENT DOCUMENTS

| | | | |
|---|---|---|---|
| 4,959,964 | 10/1990 | Saho et al. | 62/51.1 |
| 5,101,638 | 4/1992 | White | 62/51.1 |
| 5,181,385 | 1/1993 | Saho et al. | 62/51.1 |
| 5,339,650 | 8/1994 | Hakamada et al. | 62/51.1 |
| 5,412,363 | 5/1995 | Breneman et al. | 62/51.1 |
| 5,461,873 | 10/1995 | Longsworth | 62/51.1 |
| 5,563,566 | 10/1996 | Laskaris et al. | 62/51.1 X |

*Primary Examiner*—Christopher Kilner
*Attorney, Agent, or Firm*—Oblon, Spivak, McClelland, Maier & Neustadt, P.C.

[57] ABSTRACT

A magnetic resonance imaging apparatus generates a radiofrequency magnetic field to excite magnetization spins of a subject placed in a static magnetic field, and which receives magnetic resonance signals generated from the excited magnetization spins so as to generate an image of the subject based on the received magnetic resonance signals. A superconducting coil carries out at least one of generation of the radiofrequency magnetic field and a reception of the magnetic resonance signals. A cryostat has a refrigerant container therein. The refrigerant container contains refrigerant and the superconducting coil. A flow space is formed between the refrigerant container and a surface of the cryostat. Fluid having appropriate temperature and amount of supply is made to flow to the flow space, thereby temperature of a surface of the cryostat can be maintained in a predetermined range. The subject is directly placed on the surface of the cryostat. Since the temperature of the surface of the cryostat is maintained in the predetermined range, the subject can lay on the surface of the cryostat for a relatively long period of time. Thus, time for photographing is not limited. It is necessary to sufficiently thicken insulating material to maintain the temperature of the surface of the cryostat with insulating material. However, the thickness of the insulting material results in separating the subject from the superconducting coil and reducing sensitivity of receiving the magnetic resonance signals. According to the present invention, the superconducting coil can be made closer to the subject, so that reduction of the sensitivity of receiving can be restrained.

23 Claims, 5 Drawing Sheets

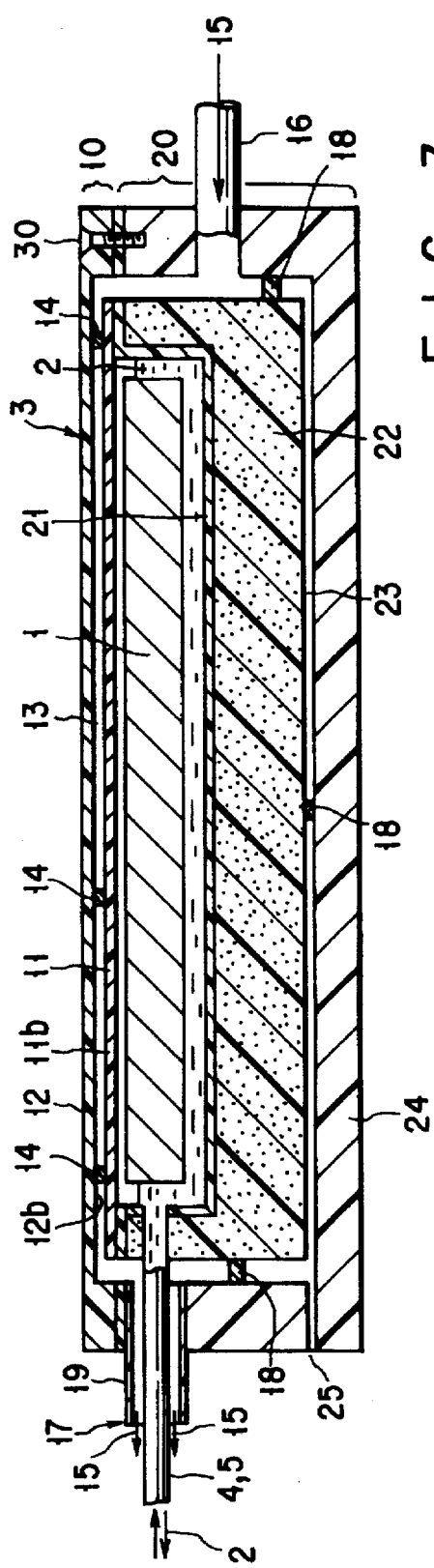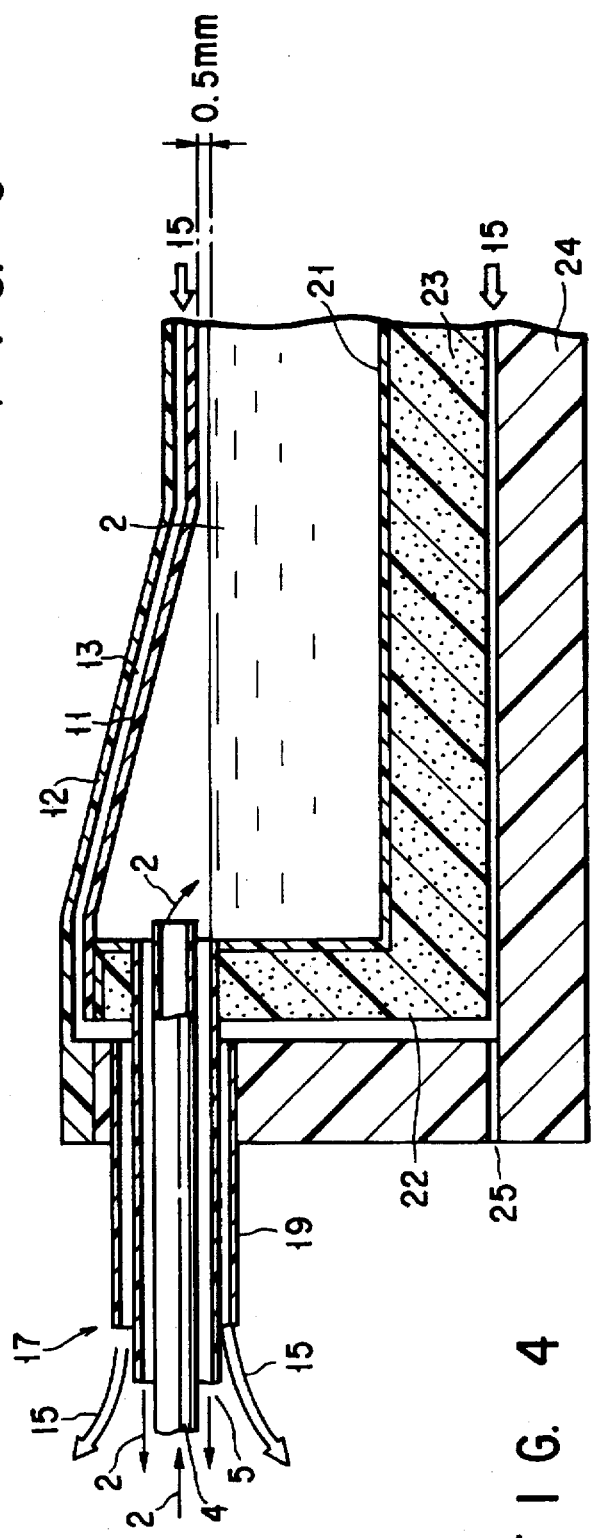

MAGNETIC RESONANCE DIAGNOSTIC APPARATUS

BACKGROUND OF THE INVENTION

1. Field of the Invention

The present invention relates to a magnetic resonance imaging apparatus using a superconducting coil as a radiofrequency coil for carrying out at least one of generation of a radiofrequency magnetic field and a reception of magnetic resonance signals.

2. Description of the Related Art

Generally, when magnetization spins having a characteristic magnetic moment are placed in a static magnetic field, there is generated a phenomenon in which the magnetization spins resonates to a radiofrequency magnetic field rotating at a specific frequency. By use of this phenomenon, a magnetic resonance imaging apparatus obtains data of a tissue structure of a living body and data of functions.

The radiofrequency coil generates the radiofrequency magnetic field, and detects magnetic resonance signal. The radiofrequency coil is formed of a thin copper plate.

To improve sensitivity of receiving the magnetic resonance signal, the use of a superconducting coil as a radiofrequency coil has been recently reviewed. The superconducting coil is contained in a cryostat to maintain a superconducting state.

FIG. 1 shows a cross sectional view of a conventional cryostat. The conventional cryostat comprises refrigerant 102 such as liquid nitrogen, an insulating container 120 for saving refrigerant, and a cover 110 for the insulating container 120. An auxiliary tank 108 is formed on a bottom portion of the insulating container 120 to extend time for maintaining refrigerant effect. A superconducting coil 101 is immersed in the refrigerant 102 so as to be cooled. A surface of the cover 110 forms a part of a surface of a table for mounting a subject thereon.

In the above-mentioned cryostat, there are problems as follows.

(1) Since the sensitivity of receiving the magnetic resonance signal is improved by making the superconducting coil 10 closer to the subject, the cover 110 is produced with the thinnest thickness possible. However, if the cover 110 is thinned, an insulation effect can not be fully obtained, and a surface temperature of the cover 110 is greatly reduced. The subject contacting the surface of the cover 110 cannot withstand the low temperature and dew formation. As a result, the reduction of the surface temperature causes a decrease in time for photographing.

(2) When the refrigerant 102 is injected into the container 120, thermal stress concentrates on specific portions of the container 120 and the cover 110. As a result, the container 120 and the cover 110 may be broken and the refrigerant 102 may be leaked therefrom.

(3) Since cooling maintenance time is controlled by an amount of injected refrigerant 102, it is inconvenient to control photographing time.

SUMMARY OF THE INVENTION

An object of the present invention is to provide a magnetic resonance imaging apparatus, which can improve sensitivity of receiving magnetic resonance signals by making a superconducting coil closer to a subject and which can relax a considerable reduction of a surface temperature due to refrigerant for the superconducting coil.

According to a first aspect of the present invention, there is provided a magnetic resonance imaging apparatus for generating a radiofrequency magnetic field to excite magnetization spins of a subject placed in a static magnetic field, receiving magnetic resonance signals from the excited magnetization spins, and reconstructing image data for the subject based on the received magnetic resonance signals, comprising:

a superconducting coil for carrying out at least one of generation of the radiofrequency magnetic field and a reception of the magnetic resonance signals;

a cryostat including a refrigerant container for containing refrigerant, the superconducting coil being immersed in the refrigerant, and a flow space being formed between the refrigerant container and a surface of the cryostat, the surface of the cryostat being in contact with the subject; and flowing means for flowing fluid in the flow space to maintain temperature of the surface of the cryostat in a predetermined range.

According to a second aspect of the present invention, there is provided a superconducting apparatus comprising:

superconducting unit;

a cryostat having a refrigerant container containing refrigerant, the superconducting unit being immersed in the refrigerant, and a flow space being formed between the refrigerant container and a surface of the cryostat; and flowing means for flowing fluid in the flow space to maintain temperature of the surface of the cryostat in a predetermined range.

According to a third aspect of the present invention, there is provided a magnetic resonance imaging apparatus for generating a radiofrequency magnetic field to excite magnetization spins of a subject placed in a static magnetic field, receiving magnetic resonance signals from the excited spins, and reconstructing image data for the subject based on the received magnetic resonance signals, comprising:

a superconducting coil for carrying out at least one of generation of the radiofrequency magnetic field and a reception of the magnetic resonance signals;

a container for containing refrigerant, the superconducting coil being immersed in the refrigerant;

a cover for closing the container, a surface of the cover being in contact with the subject;

a flow space provided in the cover; and means for flowing fluid in the flow space to maintain temperature of the surface of the cover in a predetermined range.

According to a fourth aspect of the present invention, there is provided a magnetic resonance imaging apparatus for generating a radiofrequency magnetic field to excite magnetization spins of a subject placed in a static magnetic field, receiving magnetic resonance signals from the excited spins, and reconstructing image data for the subject based on the received magnetic resonance signals, comprising:

a superconducting coil for carrying out at least one of generation of the radiofrequency magnetic field and a reception of the magnetic resonance signals;

an inner case for containing refrigerant, the superconducting coil being immersed in the refrigerant;

an outer case for housing the inner case;

an inner cover for closing the inner case;

an outer cover for closing the outer case, a surface of the outer cover being in contact with the subject;

a flow space provided between the inner cover and the outer cover; and means for flowing fluid in the flow space to maintain temperature of the surface of the cover in a predetermined range.

The present invention can realize the .following advantages.

A superconducting coil carries out at least one of generation of the radiofrequency magnetic field and a reception of the magnetic resonance signals. A cryostat has a refrigerant container therein. The refrigerant container contains refrigerant and the superconducting coil. A flow space is formed between the refrigerant container and a surface of the cryostat. Fluid having appropriate temperature and amount of supply is made to flow to the flow space, thereby temperature of a surface of the cryostat can be maintained in a predetermined range. The subject is directly placed on the surface of the cryostat. Since the temperature of the surface of the cryostat is maintained in the predetermined range, the subject can lay on the surface of the cryostat for a relatively long period of time. Thus, time for photographing is not limited. It is necessary to sufficiently thicken insulating material to maintain the temperature of the surface of the cryostat with insulating material. However, the thickness of the insulting material results in separating the subject from the superconducting coil and reducing sensitivity of receiving the magnetic resonance signals. According to the present invention, the superconducting coil can be made closer to the subject, so that reduction of the sensitivity of receiving can be restrained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 3 is a cross sectional view of a cryostat of the embodiment of the present invention;

FIG. 4 is a cross sectional view specifically showing a triple tube of FIG. 3;

DETAILED DESCRIPTION OF THE PREFERRED EMBODIMENT

An embodiment of the present invention will be explained with reference to the drawings.

When magnetization spins having a characteristic magnetic moment are placed in a static magnetic field, there is generated a phenomenon in which the magnetization spins resonates to a radiofrequency magnetic field rotating at a specific frequency. By use of this phenomenon, a magnetic resonance imaging apparatus obtains data of a tissue structure of a living body and data of functions. The magnetic resonance imaging apparatus comprises a gantry and a computer unit.

Figure 1:
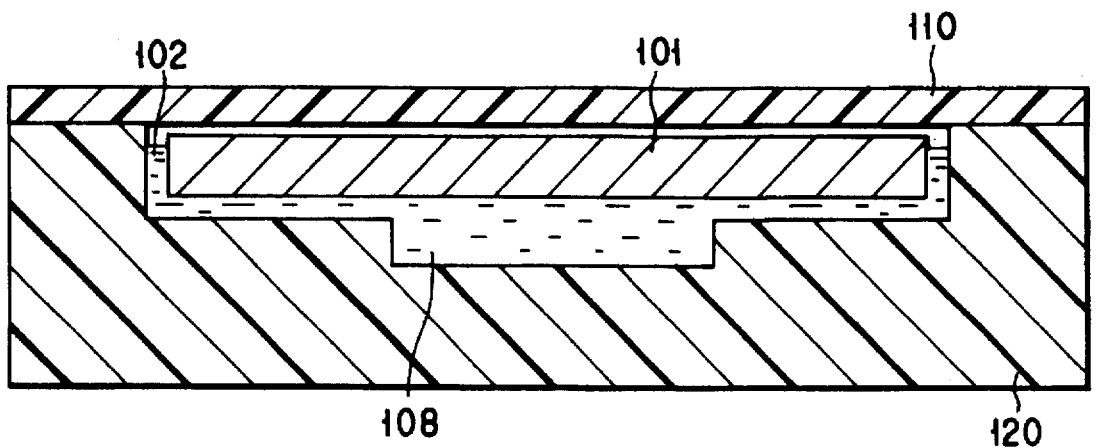
FIG. 1 is a cross sectional view of a conventional superconducting coil apparatus.
Figure 2:
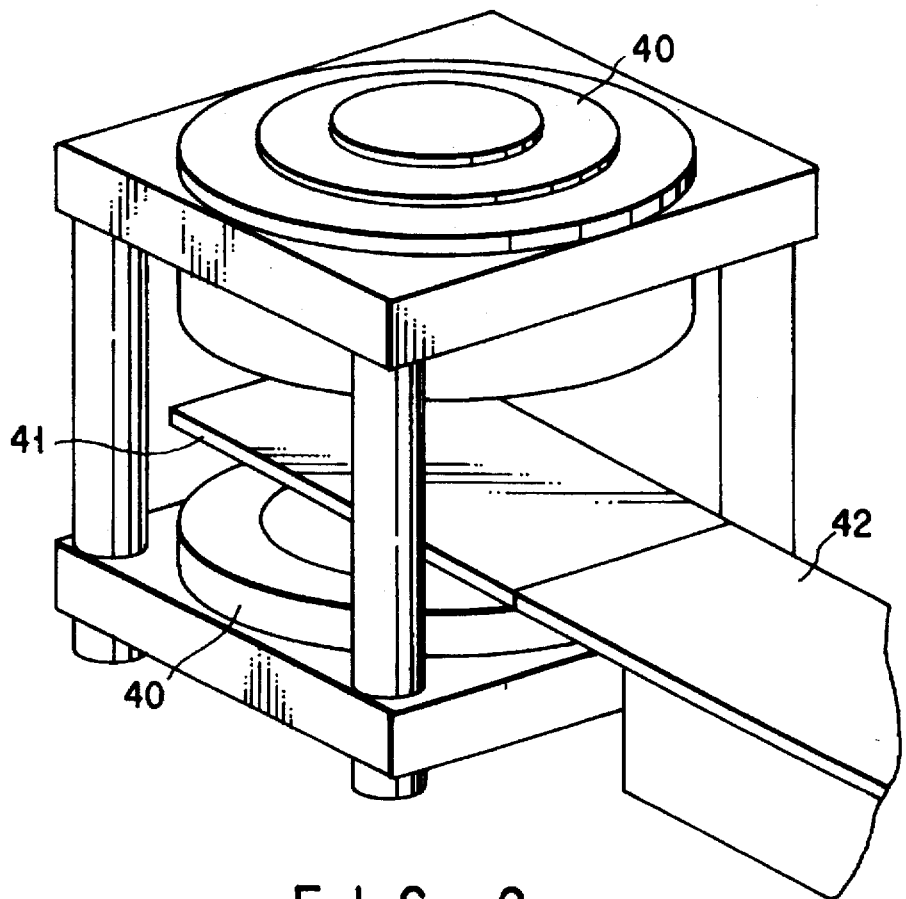
FIG. 2 shows an outline of an gantry of a magnetic resonance imaging apparatus of an embodiment of the present invention.

FIG. 2 shows an open type gantry. The gantry may be a cylindrical type or the other types. The gantry has a superconducting coil apparatus 41, a coil set 40, and a table 42 for mounting a subject thereon. A static magnetic coil and a gradient coil are incorporated into the coil set 40.

The superconducting coil apparatus 41 is the radiofrequency coil apparatus for generating the radiofrequency magnetic field to excite magnetic spins, and for detecting magnetic resonance signal. The superconducting coil apparatus 41 is formed to be relatively flat. The superconducting coil apparatus 41 is incorporated into the table 42. The surface of the superconducting coil apparatus 41 forms a part of the surface of the table 42.

FIG. 3 is a cross sectional view of the superconducting coil apparatus 41 of FIG. 2. The superconducting coil apparatus 41 comprises a superconducting coil 1 and a cryostat 3. The superconducting coil 1 is formed of a superconducting thin tape made of oxide. The cryostat 3 is used to cool the superconducting coil 1 and maintain a superconducting state. The whole structure of the cryostat 3 is formed of non-magnetic material such as fiber reinforced plastic, etc., not to distort the magnetic field.

The cryostat 3 comprises a container body 20 and a cover 10. A surface of the cover 10 forms a part of the table. The subject contacts the surface of the cover 10. A refrigerant container 21 for saving refrigerant 2, e.g., liquid nitrogen is formed in the container body 20. The superconducting coil 1 is immersed in refrigerant 2 so as to be cooled.

The refrigerant container 21 is formed of fiber reinforced plastic material. The container 21 is formed to be a one-piece having a uniform thickness. Thereby, there can be reduced possibility of generation of a crack due to concentration of thermal stress on the part of the container 21. An outer surface (side surface and bottom surface) is covered with insulating material 22 such as polyurethane, etc. The refrigerant container 21 and the insulating material 22 are contained in a housing 24. The housing 24 is formed by assembling a plurality of fiber reinforced plastic plates.

To form an interspace 23 between the insulating material 22 and the housing 24, blocks 18 are inserted between the insulating material 22 and the housing 24. The interspace 23 is a flow space where fluid 15 to be described later flows.

The cover 10 has an inner-cover 11 for the refrigerant container 21 and an outer-cover 12 for the housing 24. The inner-cover 11 and the outer-cover 12 are formed of plate-like fiber reinforced plastic.

To form an interspace 13 between the inner-cover 11 and the outer-cover 12, blocks 14 are inserted between the inner-cover 11 and the outer-cover 12. The interspace 13 is divided into an outside surface for the inner-cover 11 and an inside surface for the outer-cover 12. The number of blocks 14 is the minimum number, which can withstand the weight of the subject. The interspace 13 is a flow space where fluid 15 to be described later flows.

The container body 20 is closed by the cover 10 through silicon-rubber packing. The cover 10 is fixed to the container body 20 by a fixing screw 30 formed of fiber reinforced plastic. The fixing screw 20 is pulled out, so that the cover 10 can be detached from the container body 20. Thereby, maintenance and checking of the superconducting coil 1 and the refrigerant container 21 can be easily performed.

If the container body 20 is closed by the cover 10, the interspace 13 of the cover 10 and the interspace 23 of the container body 20 are joined together. Then, fluid 15 is made to flow into the joined interspaces 13 and 23 to prevent the surface temperature of the cover 10 from being excessively reduced. As fluid 15, there can be used dry air for preventing dew formation, nitrogen gas, or specific liquid.

The cover 10 is formed to have a thickness of 6 mm or less such that the superconducting coil 1 is made closer to the subject to improve sensitivity of receiving the magnetic resonance signal. For example, the inner-cover 11 and the outer-cover 12 are set to 2 mm, respectively. At this time, the interspace 13 is formed to have a thickness of 2 mm.

Figure 5:
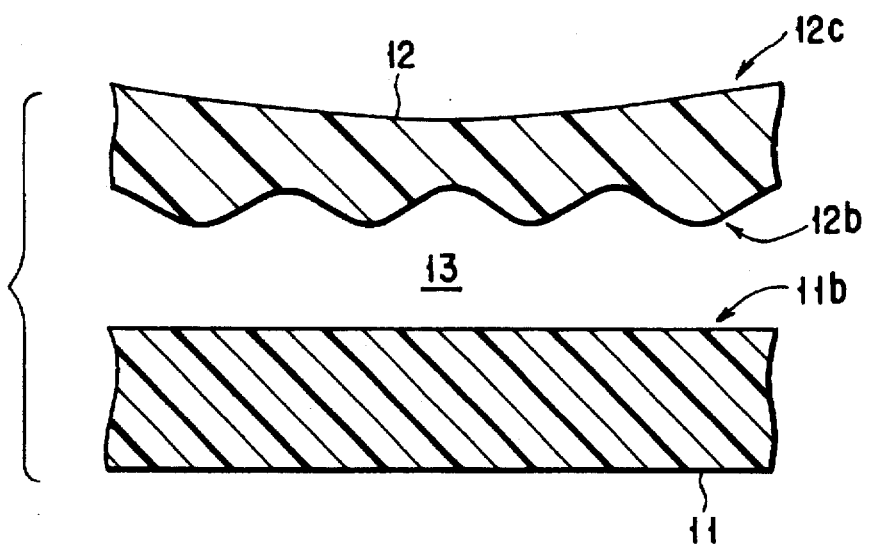
FIG. 5 is a cross sectional view showing an inner cover and an outer cover of FIG. 3.

FIG. 5 is an enlarged cross sectional view of the cover 10. An outside surface 12c of the outer-cover 12, which comes in contact with the subject, is curved along a general physique of the subject. An inside surface 12b of the outer-cover 12 is formed to be concave and convex (for example, waveform) to speed up thermal conduction from fluid 15. An outside of the inner-cover 11 is formed to have a smooth face to restrain thermal diffusion from refrigerant 2.

As shown in FIG. 3, a feed pipe 16 for fluid 15 is provided at the side of the housing 24. The feed pipe 16 is associated with the interspace 23. A triple pipe 17 is provided at the side of the housing 24 opposite to the feed pipe 16.

FIG. 4 is a cross sectional view of the triple pipe 17. The triple pipe 17 has three pipes 4, 5, and 19 each having a different diameter. The pipe 4 is inserted to the pipe 5, and the pipe 5 is inserted to the pipe 19. The pipes 4 and 5 for refrigerant 2 are associated with the inner portion of the refrigerant container 21 through the housing 24, the insulating material 22, and the refrigerant container 21. Refrigerant 2 is supplied to the refrigerant container 21 through the pipe 4. Refrigerant 2 passes through a space between the pipes 4 and 5 so as to be collected from the refrigerant container 21. Fluid 15 is sent to the interspaces 13 and 23 through the feed pipe 16, and exhausted from the interspaces 13 and 23 through a space between the pipes 5 and 19. The pipes 4 and 5 where refrigerant 2 flows is enclosed with the pipe 19 where fluid 15 flows, so that the dew formation can be prevented from being generated in the triple pipe 17.

Figure 6:
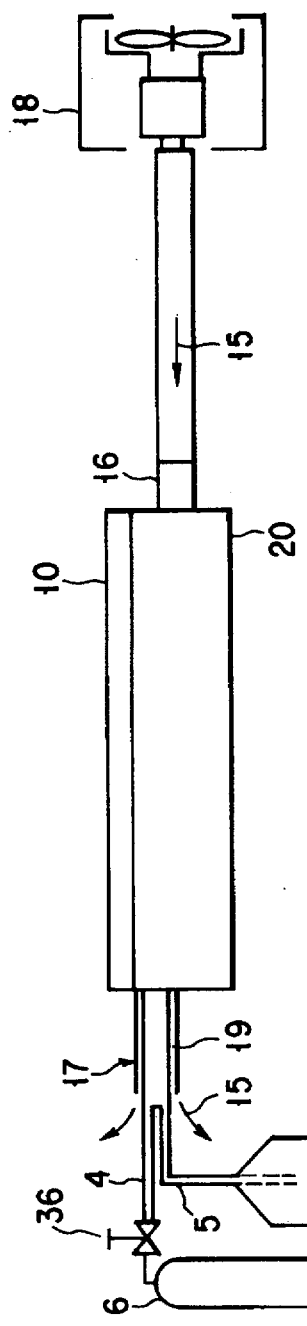
FIG. 6 is a system view of a superconducting coil apparatus of the embodiment of the present invention.

As shown in FIG. 6, fluid 15 is supplied to the interspaces (flow spaces) 13 and 23 from a fluid supply system 18 through the feed pipe 16. In the fluid supply system 18, there are provided a heater and a controllable blower are provided to control the temperature of fluid 15 and the flow rate. Fluid 15, which is cooled while flowing through the interspaces 13 and 23, is exhausted through the pipes 5 and 19. The fluid supply system 18 controls the temperature of fluid 15 and the flow rate, so that the surface of the cover 10 is maintained to be a temperature range where the subject can withstand.

Refrigerant 2 is supplied to the refrigerant container 21 from a refrigerant cylinder 6 through the pipe 4. Refrigerant 2 passes through a space between the pipes 4 and 5 so as to be collected to a collection tank 7 from the refrigerant container 21. An amount of supply of refrigerant 2 is controlled by the operation of a valve 36. The valve 36 is opened to supply refrigerant 2, so that extension of photographing time can be realized even while the photographing is executing. Moreover, refrigerant 2 is collected, so that reduction of photographing time can be realized even while the photographing is executing.

Next, the following will explain our experimental result.

As refrigerant 2, liquid nitrogen was used. As fluid 15, dry air was used. As shown in FIG. 4, for supplying refrigerant 2 to the interspaces 13 and 23, the amount of supply of refrigerant 2 was controlled such that a gasification room 33 had a thickness of 0.5 mm. Fluid 15 was sent to the interspaces 13 and 23 at temperature of 45°C. and a flow rate of 45 m³/h. In this state, a distribution of the surface temperature of the cover 10 was measured by a measuring method of an entire surface distribution using an infrared image apparatus and a measuring method of 20 fixed points using a thermocouple. As a result, the surface temperature was distributed in the range of 20°C. to 30°C.

On the other hand, when no fluid 15 was not sent to the interspaces 13 and 23 as a comparison and the measurement was performed by the same methods, the surface temperature of the cover was distributed in the range of 9°C. to −72°C.

From an amount of evaporated refrigerant 2, it can be inferred that an amount of introduced heat is about 35W when no fluid 15 is sent to the interspaces as in the comparison. Also, it can be inferred that the amount of introduced heat is about 45W when fluid 15 is sent to the interspaces as in the embodiment of this invention. It is obviously disadvantageous to supply fluid 15 having high temperature in view of the amount of introduced heat. However, it is assumed that the cryostat is applied to MRI and the subject lies on the cover 10. In this case, if the distribution of the surface temperature of the cover 10 ranges from 20°C. to 30°C., the subject can fully withstand for a long period of time if the naked subject lies on the cover. Such a temperature distribution may be realized if the cover 10 is thickened to increase the insulating effect. However, in this case, there was a disadvantage in that the distance between the subject and the superconducting coil 1 was increased and receiving sensitivity was decreased. According to the present invention, the above-mentioned distribution of the surface temperature can be obtained as thinning the cover 10 to reduce the above-explained disadvantage.

The above-explained the temperature of fluid 15 and the flow rate are of course experimental values. The temperature of fluid 15 and the flow rate are not limited to these values, and the surface of the cover 10 should be appropriately controlled to be maintained to a constant temperature range.

Since the interspace 23 formed in the container body 20 does not directly have influence on the surface temperature of the cover 10, the interspace 23 may not be formed. The reason the interspace 23 is formed in the container body 20 the flow of fluid 15 thereto is to form a drain 25. The drain 25 is formed to safely exhaust refrigerant 2 leaked from the refrigerant container 21. In this sense, the capacity of the interface 23 formed in the container body 20 may be smaller than that of the interspace 13. As a result, most of fluid 15 supplied from the feed pipe 16 may be sent to the interspace 23.

Figure 7:
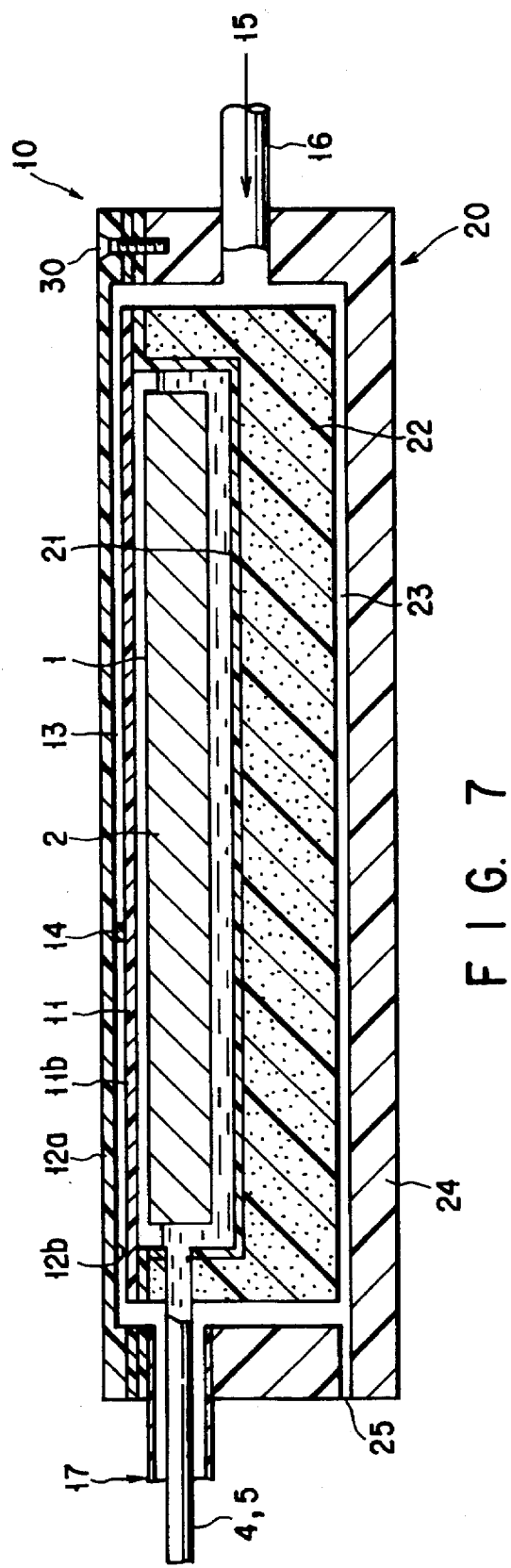
FIG. 7 is a cross sectional view of a cryostat of a first modification of the present invention.

FIG. 7 is a cross sectional view of the cryostat of a first modification. In this figure, the same reference numerals are added to the portions common to FIG. 3. In this modification, the outer-cover 12 of fiber reinforced plastic is replaced with a mat 12a formed of soft elastic material such as silicon rubber, fluoro rubber, etc.

In the cryostat shown in FIG. 3, both the inner-cover 11 and the outer-cover 12, constituting the cover 10, were formed of thin FRP plates to be integral with each other. Then, since the surface of the outer-cover 12 came in contact with the subject, the surface was curved along the physique of the subject. Such a curve shape was formed to adjust to the standard physique of the subject. However, the physical features of the subject such as height, chest, weight differ from subject to subject. It is difficult to form the outer-cover to fit to any subjects.

As shown in FIG. 7, the outer-cover 12 is formed of the mat 12a of soft and durable elastic material such as silicon rubber, fluoro rubber, etc. As a result, the individual difference in the physical features of the subject is allowable and discomfort, which is given to the subject, can be relaxed.

Figure 8:
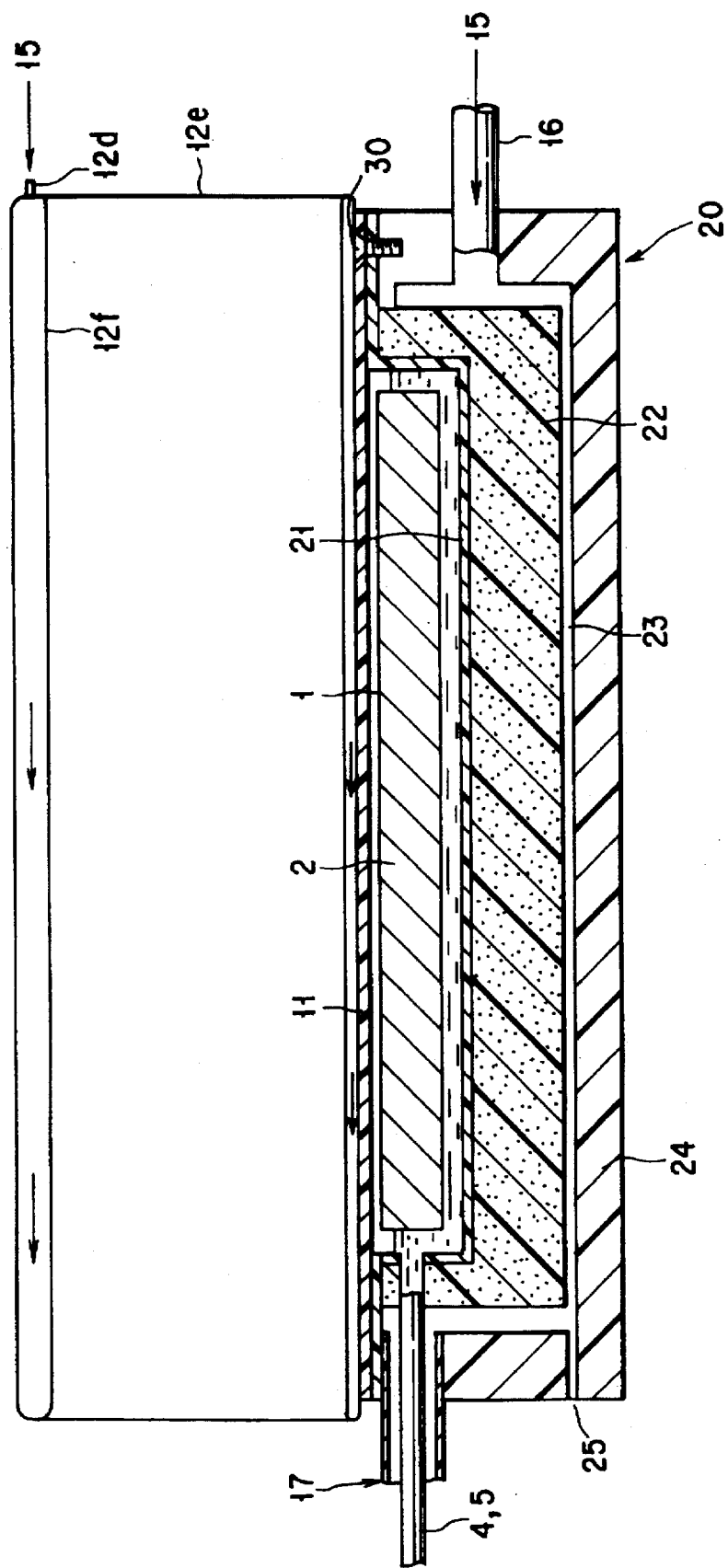
FIG. 8 is a cross sectional view of a cryostat of a second modification of the present invention.

FIG. 8 is a cross sectional view of the cryostat of a second modification. In this modification, the mat 12a of FIG. 7 is replaced with an air mat 12e, which is cylindrically formed to enclose the subject. In the example of FIG. 8, fluid 15 having a predetermined temperature and a predetermined flow rate was made to flow into the interspaces 23 and 13. In the example of FIG. 8, the air mat 12e is directly provided on the inner-cover 11 without forming the interspace 13, which is close to the subject. Then, fluid 15 supplied from a fluid entrance 12d is made to flow into the air mat 12e.

In the example of FIG. 8, fluid 15 is supplied to the interspace 23 of the container body 20. However, the interspace 23 may be omitted, so that no supply of fluid 15 is performed.

The air mat 12e is formed of a rubber film having soft and durable elastic material such as silicon rubber, fluoro rubber, etc. Moreover, the rubber film 12e is quilted. As a result, the air mat 12e can be fitted to any shapes of the subjects. In addition, since the air mat 12e is contained in the cylindrical portion, the air mat 12e has an advantage in which the subject is fixed not be moved.

In a case where fluid 15 is made to flow into the air mat 12e, it is desirable that pressure be slightly applied to the air mat 12e. Moreover, it is desirable that the container body side of the air mat 12e be structured to be thin as possible.

Figure 9:
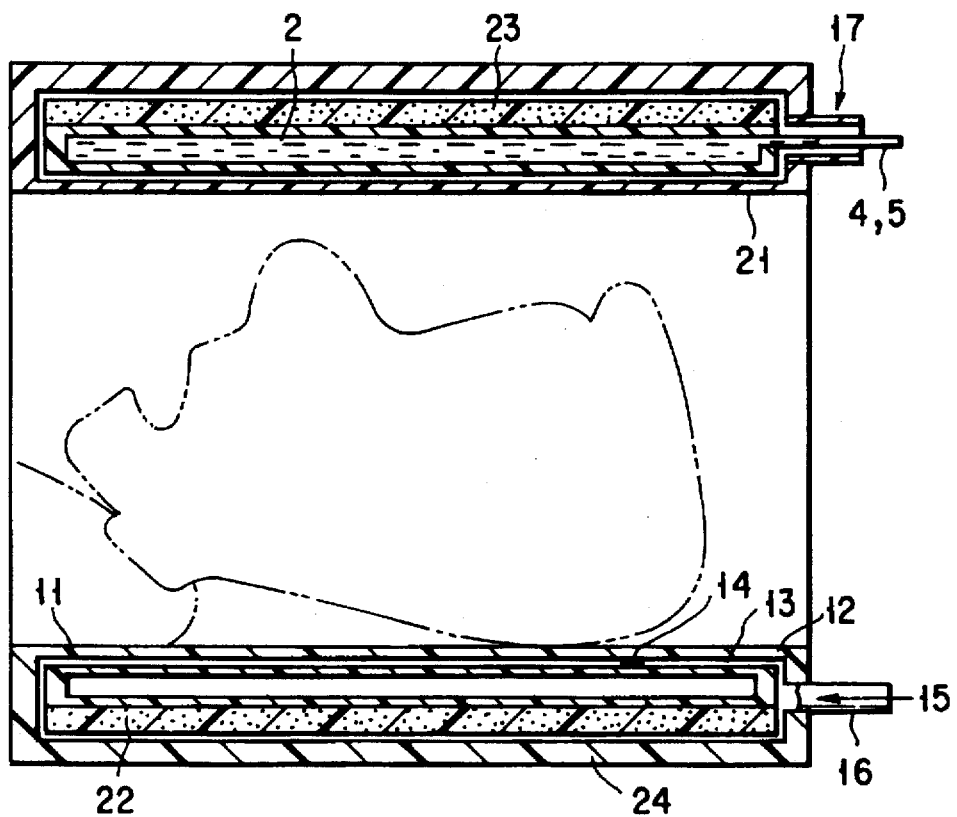
FIG. 9 is a cross sectional view of a cryostat of a third modification of the present invention.

FIG. 9 is a cross sectional view of the cryostat of a third modification. The cryostat of FIG. 9 is cylindrically formed and used to photograph, for example, a head portion. The refrigerant container 21, the inner-cover 11, the outer-cover 12, and the housing 24 are cylindrically formed of FRP materials to be integral with each other. Since fluid 15 is made to flow into the interspaces 13 and 23 and is discharged from the pipe 17, the same function and advantage as the above embodiment can be obtained.

In the above-mentioned embodiment, the tape-shape superconducting coil 1 of oxide was used. However, the superconducting coil is not limited to the tape-shape. Also, the superconducting coil is not limited to the oxide superconducting coil. In the above-mentioned embodiment, liquid nitrogen was used as refrigerant 2 because of the use of the oxide superconducting coil. If the conventional compound superconductor is used, liquid helium must be used as refrigerant 2. In addition to the basic cooling method in which the super conductive coil 1 is immersed in refrigerant 2 so as to be cooled, it is possible to indirectly cool the superconducting coil 1 with cooling gas sent from a refrigerator.

The cryostat of the present invention can be applied to various superconducting apparatus other than the above-explained MRI. For example, the present invention can be applied to, for example, a floating-type transferring apparatus using a bin stopping effect of the oxide superconductor to transfer, e.g., semiconductor wafers in a clean room. Thereby, there can be structured a thin-typed system without generating a waterdrop and frost F in the transferring apparatus.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A magnetic resonance imaging apparatus for generating a radiofrequency magnetic field to excite magnetization spins of a subject placed in a static magnetic field, receiving magnetic resonance signals from the excited magnetization spins, and reconstructing image data for the subject based on the received magnetic resonance signals, comprising:

a superconducting coil for carrying out at least one of generation of the radiofrequency magnetic field and a reception of the magnetic resonance signals;

a cryostat including a refrigerant container for containing refrigerant, said superconducting coil being immersed in the refrigerant, and a flow space being formed between said refrigerant container and a surface of said cryostat, the surface of said cryostat being in contact with the subject; and flowing means for flowing fluid in said flow space to maintain temperature of the surface of said cryostat in a predetermined range.

2. The apparatus according to claim 1, wherein said flowing means has means for controlling the temperature of said fluid and means for controlling flow rate of said fluid.

3. The apparatus according to claim 1, wherein said refrigerant container is formed of one piece made of fiber reinforced plastic.

4. The apparatus according to claim 3, wherein said refrigerant container is of uniform thickness.

5. The apparatus according to claim 1, further comprising means for collecting said refrigerant from said refrigerant container.

6. The apparatus according to claim 1, further comprising:

a first pipe for supplying said refrigerant to said refrigerant container;

a second pipe for collecting said refrigerant from said refrigerant container; and a third pipe for exhausting said fluid from said flow space, wherein said first and second pipes are inserted in said third pipe.

7. The apparatus according to claim 1, wherein:

said flow space is sandwiched between an inner cover of the refrigerant container and an outer cover of the cryostat, said outer cover having an irregular inner surface to speed up thermal conduction from said fluid, and said inner cover having a flat outside surface to restrain thermal diffusion from said refrigerant.

8. The apparatus according to claim 1, further comprising a drain for exhausting refrigerant leaked from said refrigerant container.

9. The apparatus according to claim 8, further comprising another flow space formed between said refrigerant container and a rear face of said cryostat, wherein said drain is associated with said another flow space.

10. The apparatus according to claim 1, wherein said cryostat comprises an outer surface curved along a general physique of the subject.

11. The apparatus according to claim 1, wherein the surface of said cryostat is formed of elastic material.

12. The apparatus according to claim 1, further comprising a cylindrical air mat arranged on said cryostat.

13. The apparatus according to claim 1, wherein said superconducting coil is formed of superconducting oxide tape.

14. A superconducting apparatus comprising:

a superconducting unit;

a cryostat having a refrigerant container containing refrigerant, said superconducting unit being immersed in the refrigerant, and a flow space being formed between said refrigerant container and a surface of said cryostat; and flowing means for flowing fluid in said flow space to maintain temperature of the surface of said cryostat in a predetermined range.

15. The apparatus according to claim 14, wherein said flowing means has means for controlling the temperature of said fluid and means for controlling flow rate of said fluid.

16. The apparatus according to claim 14, wherein said refrigerant container is formed of one piece made of fiber reinforced plastic.

17. The apparatus according to claim 14, further comprising means for collecting said refrigerant from said refrigerant container.

18. The apparatus according to claim 14, further comprising:

a first pipe for supplying said refrigerant to said refrigerant container;

a second pipe for collecting said refrigerant from said refrigerant container; and a third pipe for exhausting said fluid from said flow space, wherein said first and second pipes are inserted in said third pipe.

19. The apparatus according to claim 14, wherein:

said refrigerant container includes a cover having an outer surface;

said cryostat includes a cover having an inner surface;

said flow space is sandwiched between said outer surface of said cover of the refrigerant container and said inner surface of said cover of the cryostat, said inner surface of said cover of the cryostat is irregular to speed up thermal conduction from said fluid, and said outer surface of said cover of the refrigerant container is formed to have a flat face to restrain thermal diffusion from said refrigerant.

20. The apparatus according to claim 14, further comprising a drain for exhausting refrigerant leaked from said refrigerant container.

21. The apparatus according to claim 20, further comprising another flow space formed between said refrigerant container and a rear face of said cryostats, wherein said drain is associated with said another flow space.

22. A magnetic resonance imaging apparatus for generating a radiofrequency magnetic field to excite magnetization spins of a subject placed in a static magnetic field, receiving magnetic resonance signals from the excited spins, and reconstructing image data for the subject based on the received magnetic resonance signals, comprising:

a superconducting coil for carrying out at least one of generation of the radiofrequency magnetic field and a reception of the magnetic resonance signals;

a container for containing refrigerant, the superconducting coil being immersed in said refrigerant;

a cover for closing said container, a surface of said cover being in contact with the subject;

a flow space provided in said cover; and means for flowing fluid in said flow space to maintain temperature of the surface of said cover in a predetermined range.

23. A magnetic resonance imaging apparatus for generating a radiofrequency magnetic field to excite magnetization spins of a subject placed in a static magnetic field, receiving magnetic resonance signals from the excited spins, and reconstructing image data for the subject based on the received magnetic resonance signals, comprising:

a superconducting coil for carrying out at least one of generation of the radiofrequency magnetic field and a reception of the magnetic resonance signals;

an inner case for containing refrigerant, the superconducting coil being immersed in said refrigerant;

an outer case for housing said inner case;

an inner cover for closing said inner case;

an outer cover for closing said outer case, a surface of said outer cover being in contact with the subject;

a flow space provided between said inner cover and said outer cover; and means for flowing fluid in said flow space to maintain temperature of the surface of said cover in a predetermined range.

* * * * *